(12) United States Patent
Liu et al.

(10) Patent No.: US 12,490,505 B2
(45) Date of Patent: Dec. 2, 2025

(54) GATE DIELECTRIC HAVING A NON-UNIFORM THICKNESS PROFILE

(71) Applicant: Taiwan Semiconductor Manufacturing Company, Ltd., Hsin-Chu (TW)

(72) Inventors: Pang-Hsuan Liu, Hsinchu (TW); Kuan-Lin Yeh, Hsinchu (TW); Chun-Sheng Liang, Changhua County (TW); Hsin-Che Chiang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 205 days.

(21) Appl. No.: 18/061,688

(22) Filed: Dec. 5, 2022

(65) Prior Publication Data
US 2023/0102368 A1    Mar. 30, 2023

Related U.S. Application Data

(62) Division of application No. 17/097,975, filed on Nov. 13, 2020, now Pat. No. 11,521,971.

(51) Int. Cl.
*H10D 84/83*    (2025.01)
*H10D 64/01*    (2025.01)
(Continued)

(52) U.S. Cl.
CPC ......... *H10D 84/834* (2025.01); *H10D 64/017* (2025.01); *H10D 64/516* (2025.01);
(Continued)

(58) Field of Classification Search
CPC ............... H01L 27/0886; H01L 29/785; H01L 29/66795; H01L 21/823431; H01L 21/823462; H01L 21/823857
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |

(Continued)

FOREIGN PATENT DOCUMENTS

WO    WO2020222853 A1    11/2020

*Primary Examiner* — Tuan A Hoang
(74) *Attorney, Agent, or Firm* — HAYNES AND BOONE, LLP

(57) ABSTRACT

A first dielectric layer is formed over upper and side surfaces of a semiconductor fin structure. A mask layer is formed over a first portion of the first dielectric layer disposed over the upper surface of the fin structure. The mask layer and the first dielectric layer have different material compositions. Second portions of the first dielectric layer disposed on side surfaces of the fin structure are etched. The mask layer protects the first portion of the first dielectric layer from being etched. A second dielectric layer is formed over the mask layer and the side surfaces of the fin structure. An oxidation process is performed to convert the mask layer into a dielectric material having substantially a same material composition as the first or second dielectric layer. The dielectric material and remaining portions of the first or second dielectric layer collectively serve as a gate dielectric of a transistor.

20 Claims, 18 Drawing Sheets

(51) Int. Cl.
*H10D 64/27* (2025.01)
*H10D 84/01* (2025.01)
*H10D 84/03* (2025.01)
H10D 30/01 (2025.01)
H10D 30/67 (2025.01)

(52) U.S. Cl.
CPC ..... *H10D 84/0144* (2025.01); *H10D 84/0158* (2025.01); *H10D 84/0181* (2025.01); *H10D 84/038* (2025.01); *H10D 30/014* (2025.01); *H10D 30/6735* (2025.01); *H10D 64/514* (2025.01)

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 8,963,258 B2 | 2/2015 | Yu et al. |
| 9,093,514 B2 | 7/2015 | Tsai et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,520,482 B1 | 12/2016 | Chang et al. |
| 9,548,303 B2 | 1/2017 | Lee et al. |
| 9,576,814 B2 | 2/2017 | Wu et al. |
| 2013/0285116 A1 | 10/2013 | Lochtefeld et al. |
| 2017/0033013 A1* | 2/2017 | Kim ................... H10D 84/038 |
| 2018/0350969 A1* | 12/2018 | Ching ................. H10D 84/834 |
| 2019/0189779 A1 | 6/2019 | Li et al. |

\* cited by examiner

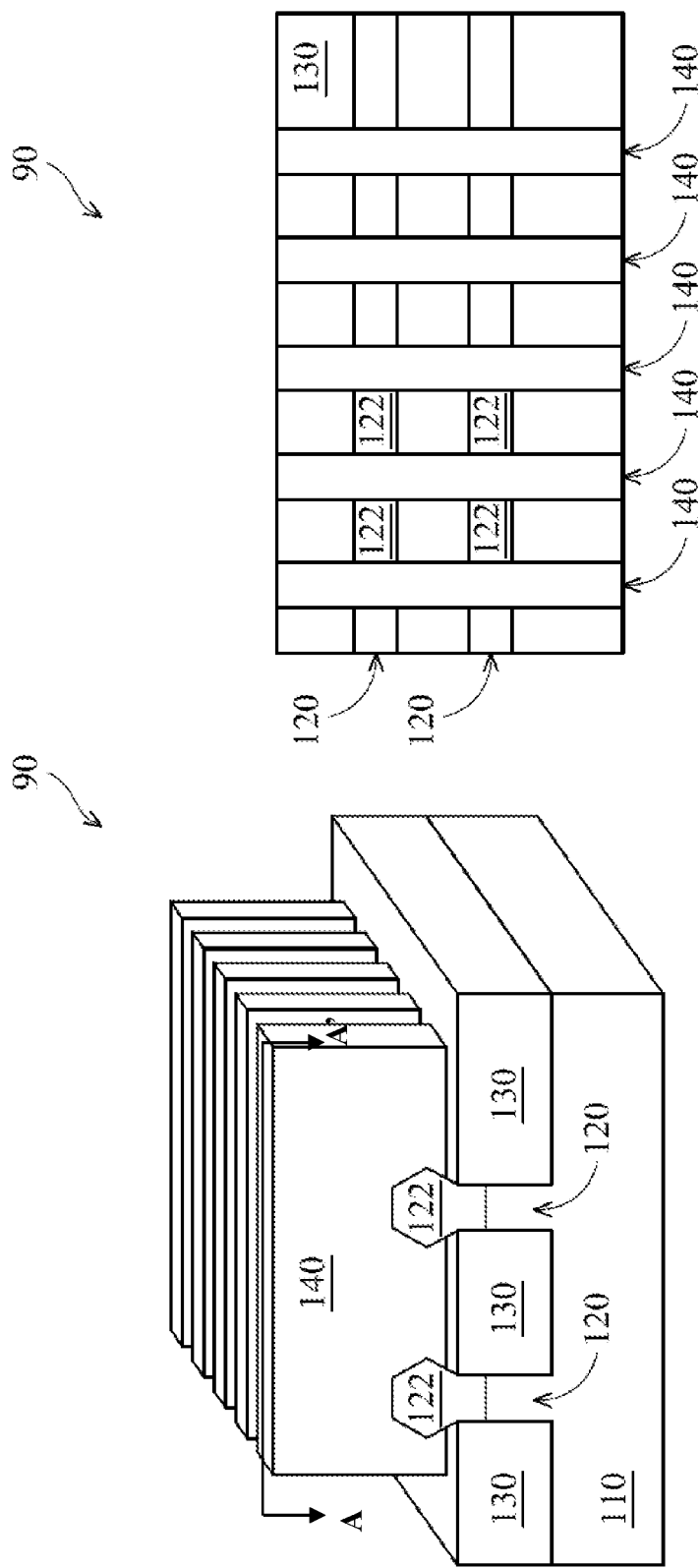
Fig.1A
Fig.1B

GATE DIELECTRIC HAVING A NON-UNIFORM THICKNESS PROFILE

PRIORITY DATA

The present application is a Divisional Application of U.S. patent application Ser. No. 17/097,975, filed Nov. 13, 2020, entitled "Gate Dielectric Having a Non-Uniform Thickness Profile", which is issued as U.S. Pat. No. 11,521,971 on Dec. 6, 2022, the disclosures of each of which are hereby incorporated by reference in their entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as the size of the gate of a transistor continues to get scaled down in each technology node, the etching processes performed during fabrication may cause unintended damage, such as the loss of a height of semiconductor fin structures. This loss of fin height could degrade device performance or lower yield. Unfortunately, as semiconductor fabrication progresses to smaller technology nodes, conventional methods of preventing or reducing the loss of fin height may become increasingly impractical as the spacing between adjacent fin structures shrinks.

Therefore, although existing semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 1A illustrates a three-dimensional perspective view of a FinFET device.

FIG. 1B illustrates a top view of a FinFET device.

DETAILED DESCRIPTION

Figure 1C:
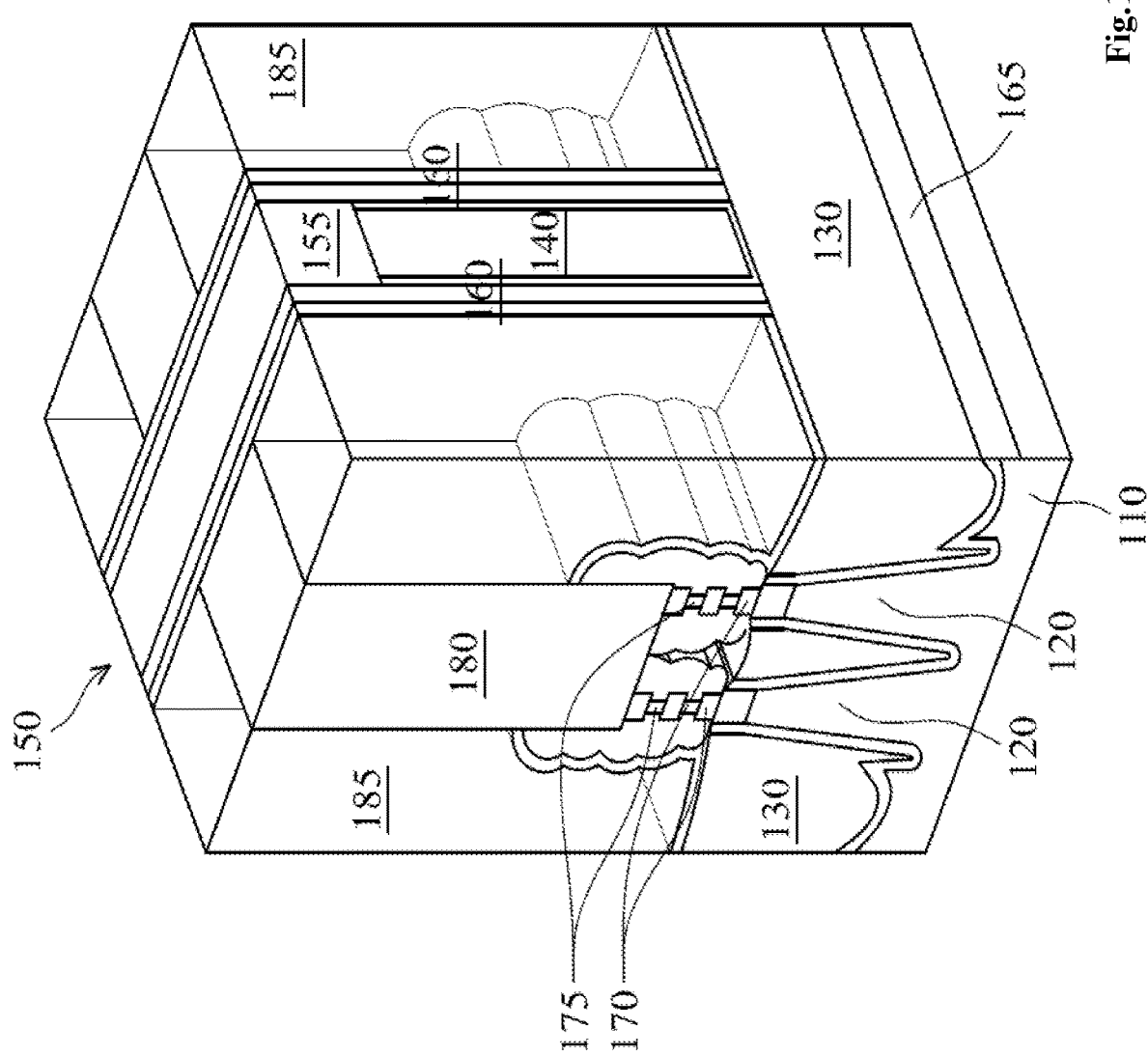
FIG. 1C illustrates a three-dimensional perspective view of a multi-channel gate-all-around (GAA) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, which may be fabricated using field-effect transistors (FETs) such as three-dimensional fin-line FETs (FinFETs) or multi-channel gate-all-around (GAA) devices. FinFET devices have semiconductor fin structures that protrude vertically out of a substrate. The fin structures are active regions, from which source/drain regions and/or channel regions are formed. The gate structures partially wrap around the fin structures. GAA devices have multiple elongated nano-structure channels that may be implemented as nano-tubes, nano-sheets, or nanowires. In recent years, FinFET devices and GAA devices have gained popularity due to their enhanced performance compared to conventional planar transistors. However, as semiconductor device sizes continue to get scaled down, the distance between adjacent fin structures also shrinks, which may lead to potential problems.

In more detail, FinFET device fabrication may involve a gate replacement process, in which a dummy polysilicon gate electrode is removed via etching processes and replaced by a metal gate electrode. As the distance between adjacent fin structures (e.g., also referred to as fin-to-fin spacing) shrinks, it may be more difficult to fully remove the dummy polysilicon gate electrode. The incomplete removal of the dummy polysilicon gate electrode may leave a polysilicon residue between the fin structures, which may degrade device performance. Therefore, conventional FinFET fabrication processes may attempt to completely remove the dummy polysilicon gate electrode using greater etching processes, for example with a longer etching time and/or a stronger etchant. However, while this approach may leave no more dummy polysilicon gate electrode residue, the etching may be excessive, to the point that the fin structures themselves are affected (e.g., partially removed, thereby reducing a height of the fin structures). This undesirable phenomenon may be referred to as a fin top loss, which also may adversely affect the device performance and/or lower the device yield.

To prevent the fin top loss, one approach is to thicken an oxide layer that is formed on the fin structures as a protective layer. The thicker the oxide layer, the more it is able to protect the fin structures located therebelow from being inadvertently etched during the dummy polysilicon gate electrode removal process. Unfortunately, since the protective oxide layer is typically formed conformally on the fin structures, thickening the protective oxide layer also has the undesirable side effect of reducing the fin-to-fin spacing. This problem is exacerbated as the device sizes are being scaled down. As discussed above, the reduction in fin-to-fin spacing may once again make the complete removal of the dummy polysilicon electrode more difficult, thereby leading to undesirable polysilicon residue again.

The present disclosure overcomes these problems discussed above by forming a protective layer having a top-thick-side-narrow profile over the fin structures. In other words, the protective layer (e.g., silicon oxide) formed over the fin structures may be thicker at the top, so that it can withstand more etching in order to sufficiently protect the fin structures below. Meanwhile, the protective layer is also thinner at the sides, which means that there can still be a sufficient amount of fin-to-fin spacing. In some embodiments, multiple deposition and etching processes are used to achieve this top-thick-side-narrow profile for the protective layer, as discussed in more detail below with reference to FIGS. 2-14.

FIGS. 1A and 1B illustrate a three-dimensional perspective view and a top view, respectively, of a portion of an Integrated Circuit (IC) device 90 that is implemented using FinFETs. Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fin structures 120 or fin structures 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fin structures 120. The source/drain features 122 may include epi-layers that are epitaxially grown on the fin structures 120. The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIG. 1B, multiple fin structures 120 are oriented lengthwise along the X-direction, and multiple gate structure 140 are oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 are disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

FIGS. 2-14 illustrate the cross-sectional side views of an IC device 200 at different stages of fabrication. FIGS. 2-14 correspond to the cross-sectional cuts taken along a Y-direction, for example along the cutline A-A' in FIG. 1A. As such, FIGS. 2-14 may be referred to as Y-cut Figures.

Figure 2:
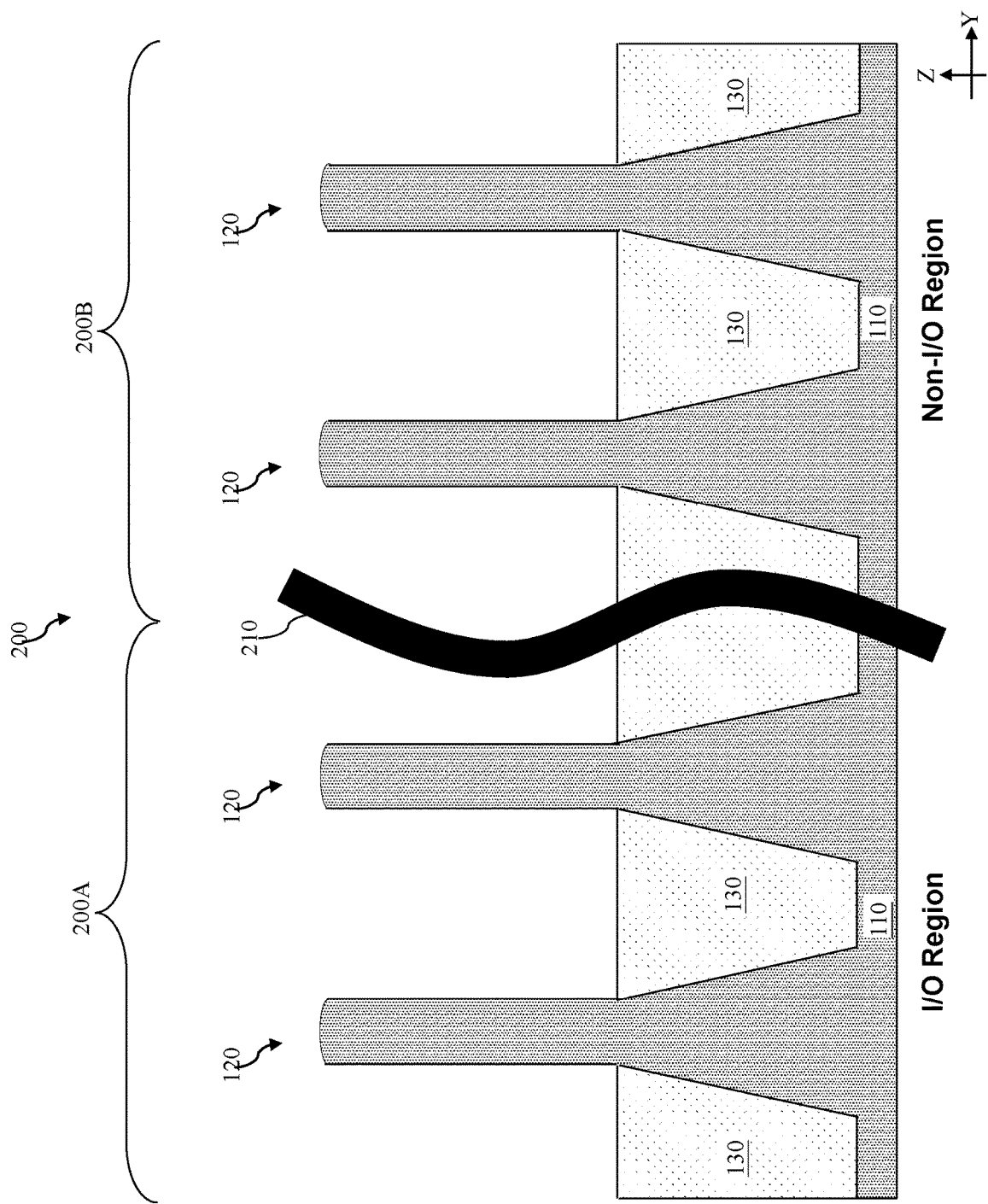
FIGS. 2-14 illustrate a series of cross-sectional views of a semiconductor device at various stages of fabrication according to embodiments of the present disclosure.

Referring to FIG. 2, the IC device 200 includes an input-output (I/O) region 200A and a non-input/output (non-I/O) region 200B. Although the I/O region 200A and the non-I/O region are shown together in FIG. 2 and the subsequent figures for reasons of simplicity, it is understood that these two regions may or may not be contiguous with each other. Their physical and/or electrical separation is denoted herein using a squiggly line 210, which does not correspond to any physical component of the IC device 200.

The I/O region 200A includes I/O transistors that are configured to handle the input and/or output of the IC device 200. The non-I/O region 200B includes transistors that are used for other IC applications other than input or output of the IC device 200, for example transistors in Static Random Access Memory (SRAM) cells (or other electronic memory storage circuits), logic circuits (e.g., circuits used to control the operation of the SRAM cells, such as row decoder circuits, column decoder circuits, bit-line control circuits, read/write drivers), radio frequency (RF) circuits (or other types of communication circuits), microcontrollers, etc. These circuits in the non-I/O region 200B are the "core" devices of the IC device 200, and as such, the non-I/O region 200B may also be referred to as a core region 200B.

The transistors in the I/O region 200A and the non-I/O region 200B have different functionalities, which correspond with different design and/or manufacturing concerns and requirements. For example, compared to the non-I/O transistors, the I/O transistors need to handle to tolerate a greater amount of voltage and/or current, for example, a voltage of greater than about 1.5 volts. In comparison, the non-I/O transistors may only need to handle or tolerate a voltage that is greater than about 0.75 volts. Meanwhile, the non-I/O transistors may need to achieve much faster speed than the I/O transistors and/or may be more sensitive to factors such as noise or device parasitics than the I/O transistors. Due to these differences, the transistors in the I/O region 200A may be optimized differently than the transistors in the non-I/O region 200B, as will be discussed in greater detail below.

Still referring to FIG. 2, in both the I/O region 200A and the non-I/O region 200B, the IC device 200 includes a substrate 110 discussed above with reference to FIGS. 1A-1C, for example a silicon substrate. A plurality of active regions may be formed on the substrate 110. For example, the active regions may include the fin structures 120 discussed above with reference to FIGS. 1A-1B, which protrude vertically upwards (in the Z-direction) out of the substrate 110. In some embodiments, the fin structures 120 are formed by patterning the substrate 110. The fin structures 120 each extend laterally in the X-direction. The bottom portions of the fin structures 120 are separated from one another in the Y-direction by the isolation structures 130, which is also discussed above with reference to FIGS. 1A-1B. In the illustrated embodiment, the isolation structures 130 include shallow trench isolation (STI) structures.

Figure 3:
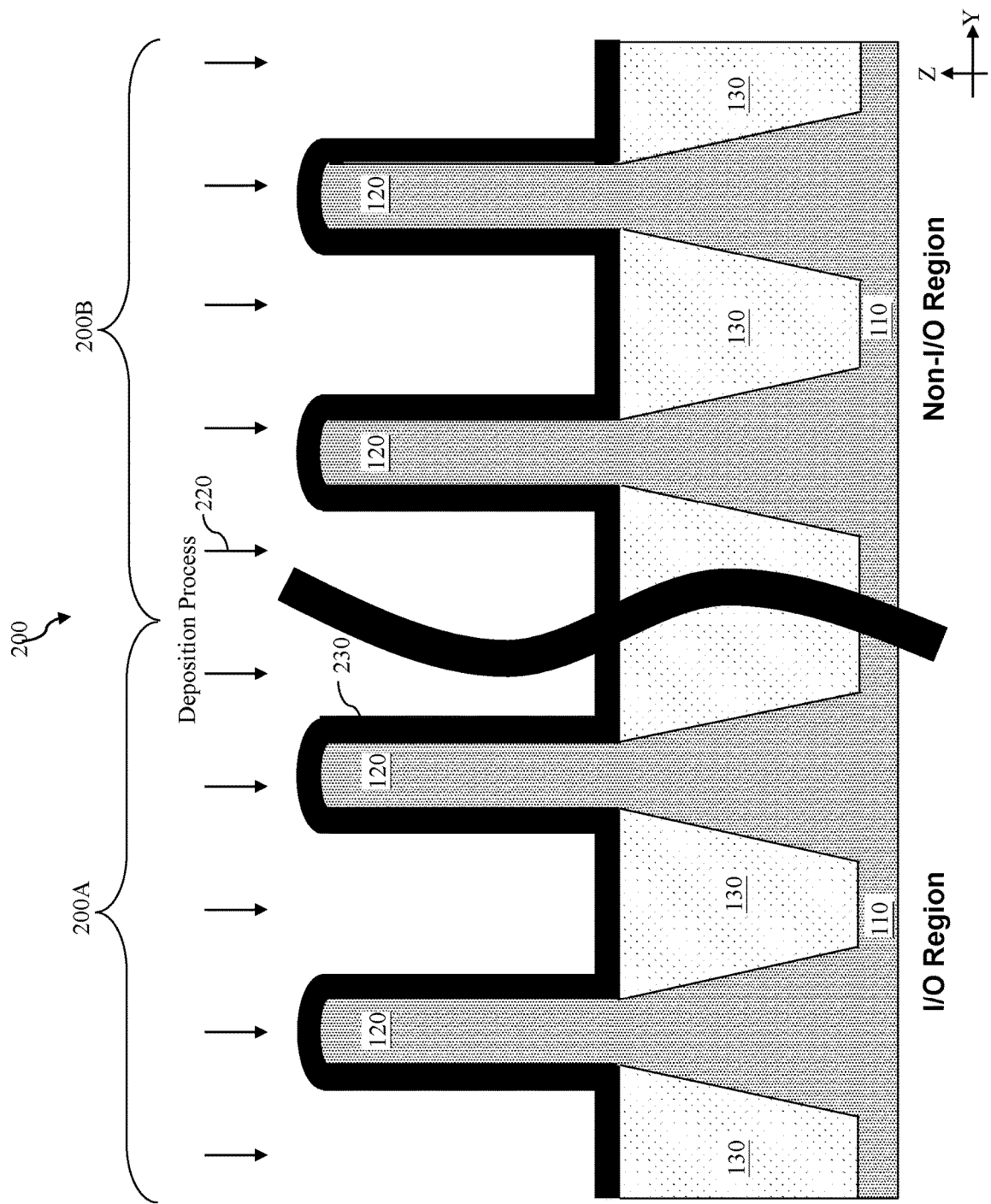

Referring now to FIG. 3, a first step of a deposition process 220 is performed to the IC device 200 to form a dielectric layer 230. In some embodiments, the deposition process 220 include a plasma enhanced atomic layer deposition (PEALD) process, which is performed in a PEALD chamber. The first step of the deposition process 220 is performed using silicon and oxygen precursors (e.g., in an alternating and repeating manner). As a result, the dielectric layer 230 is formed to contain silicon and oxygen. For example, a silicon oxide layer may be formed as the dielectric layer 230. As is shown in FIG. 3, the dielectric layer 230 may be formed conformally over the fin structures 120. Thus, the portions of the dielectric layer 230 formed on sidewalls of the fin structures 120 may have substantially similar thicknesses as the portions of the dielectric layer 230 formed on top or upper surfaces of the fin structures 120.

Figure 4:
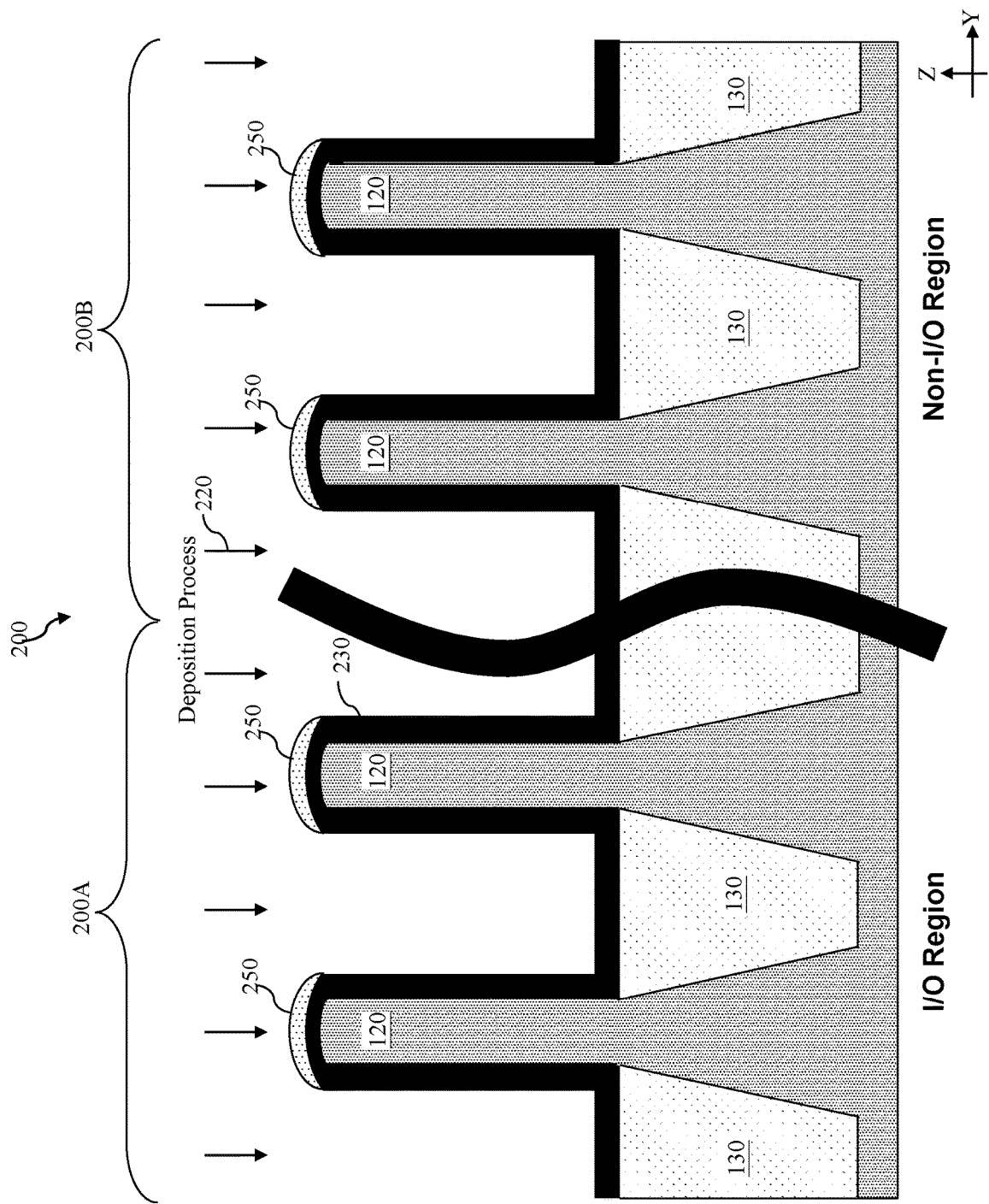

Referring now to FIG. 4, a second step of the deposition process 220 is performed to the IC device 200 to form a mask layer 250 over the top surfaces of the dielectric layer 230. The second step of the deposition process 220 may be performed in the same PEALD chamber that was used to carry out the first step of the deposition process 220, and it may be performed by turning off the oxygen precursor but still leaving the silicon precursor on. As such, the mask layer 250 is formed substantially without oxygen. In some embodiments, the mask layer 250 may be formed to include silicon carbon nitride (SiCN). The presence of carbon and nitrogen in the mask layer 250 is due to the existence of carbon and nitrogen in the silicon precursor, which may be Bis(diethylamino)silane=BDEAS=SAM-24=(Et$_2$N)$_2$SiH$_2$=H2Si[N(C2 H5)2]2. The fact that the mask layer 250 has a different material composition than the dielectric layer 230 (e.g., SiCN versus SiO$_2$) means that etching selectivity can be configured between the mask layer 250 and the dielectric layer 230 in a subsequently performed etching process, which will be beneficial according to aspects of the present disclosure, as discussed below in more detail.

Figure 5:
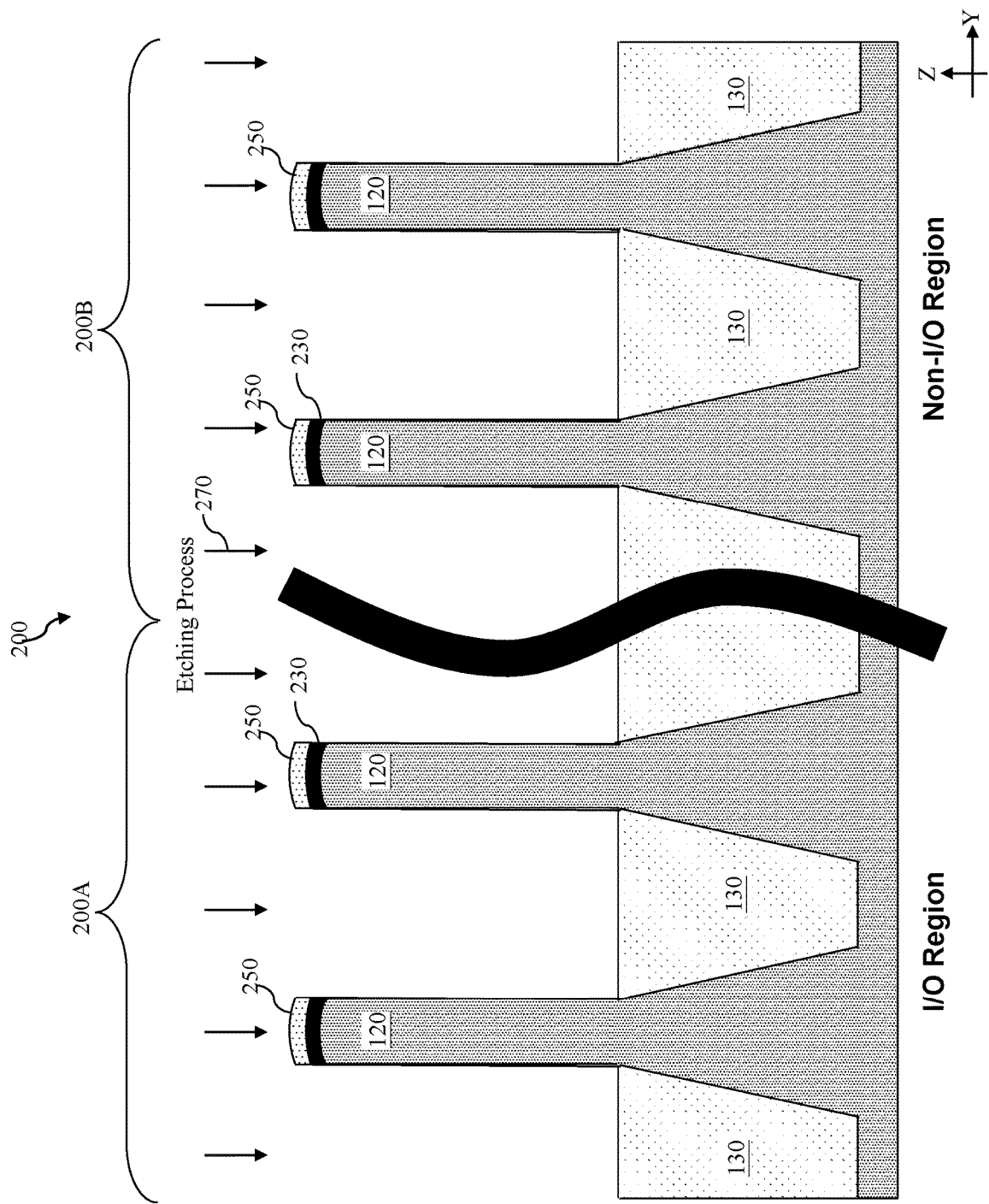

Referring now to FIG. 5, an etching process 270 is performed to the IC device 200 to selectively remove the dielectric layer 230. In more detail, the etching process 270 is configured to have an etching selectivity between the dielectric layer 230 and the mask layer 250, such that the dielectric layer 230 is etched away at a substantially faster etching rate (e.g., 5 times faster, or 10 times faster) than the mask layer 250. Since the mask layer 250 is disposed on the top surfaces of the dielectric layer 230 but not on the side surfaces of the dielectric layer 230, the mask layer 250 is able to protect the top portions of the dielectric layer 230 (i.e., the portions located directly below the mask layer 250) from being etched during the etching process 270. In some embodiments, the portions of the dielectric layer 230 disposed on the side surfaces of the fin structures 120 are substantially etched away, thereby completely exposing the side surfaces of the fin structures 120. The etching process 270 may be referred to as a sidewall trimming process. After the performance of the etching process 270, located on the upper surfaces of the fin structures 120 are the remaining portions of the dielectric layer 230 and the mask layer 250.

Figure 6:
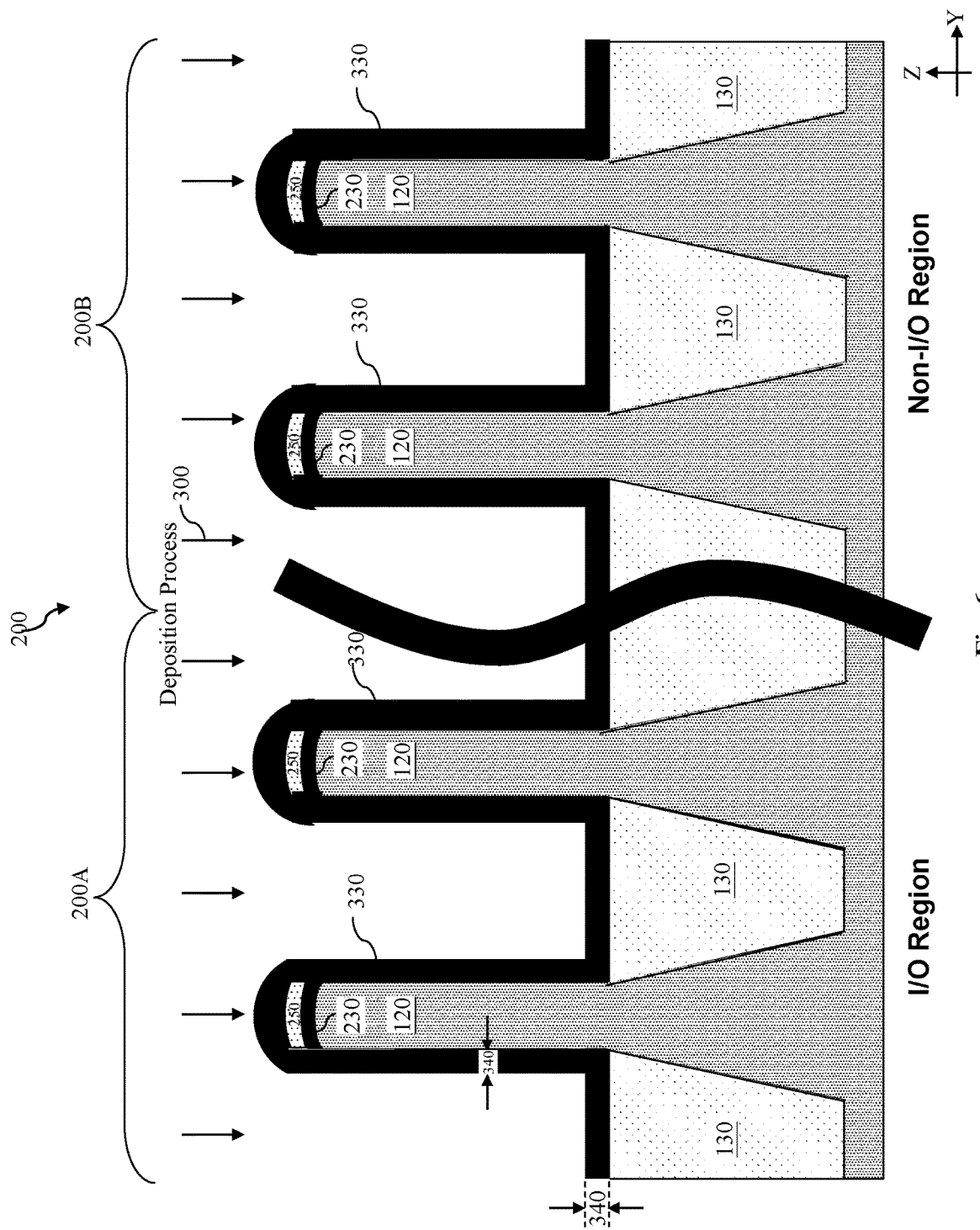

Referring now to FIG. 6, a deposition process 300 is performed to the IC device 200 to form a dielectric layer 330 over the top surfaces of the mask layer 250 and over the side surfaces of the fin structures 120, the dielectric layer 230, and the mask layer 250. In some embodiments, the deposition process 300 is a conformal deposition process, such that the different portions of the deposited dielectric layer 330 have a relatively uniform thickness 340 regardless of where they are deposited. In some embodiments, the deposition process 300 also includes a PEALD process and may be performed in the same PEALD chamber that was used to form the dielectric layer 230 and the mask layer 250. The deposition process 300 is configured such that the material composition of the dielectric layer 330 is substantially the same as the material composition of the dielectric layer 230. Therefore, in embodiments where the dielectric layer 230 is a silicon oxide layer, the dielectric layer 330 may also be a silicon oxide layer.

Figure 7:
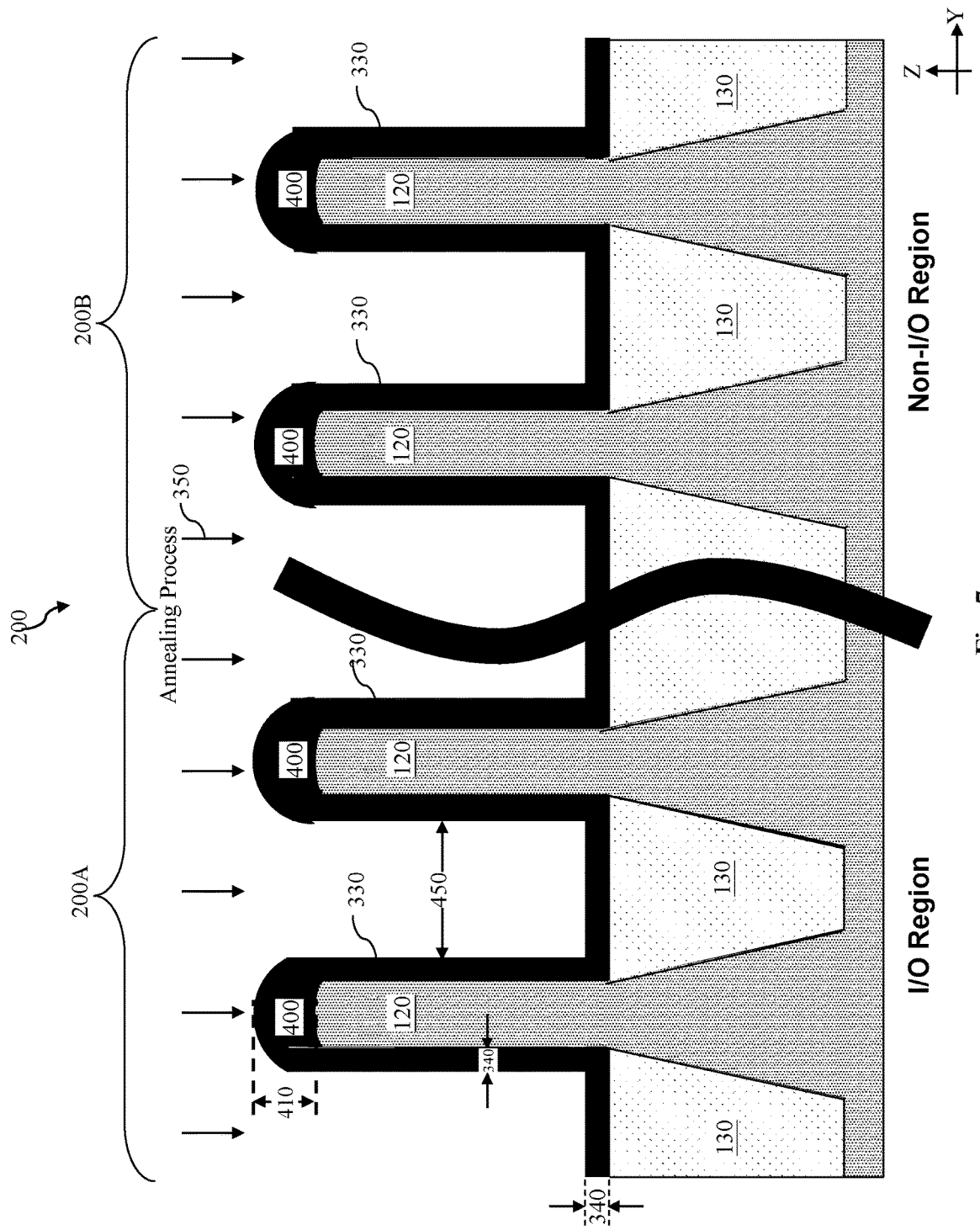

Referring now to FIG. 7, an annealing process 350 is performed to the IC device 200 to convert the mask layer 250 into a material having the same material composition as the dielectric layer 230 and the dielectric layer 330. In some embodiments, the annealing process 350 includes an oxygen annealing process, which oxidizes the mask layer 250. As a result, the mask layer 250 is converted into silicon oxide in embodiments where the dielectric layers 230 and 330 are silicon oxide. Therefore, dielectric segments 400 are formed by a combination of the oxidized mask layers 250 and the top portions of the dielectric layers 230 and 330. At this stage of fabrication, the dielectric segments 400 are located on the top surfaces of the fin structures 120, while the remaining segments of the dielectric layer 330 are located on the side surfaces of the fin structures 120. The dielectric segments 400 and the dielectric layer 330 will collectively serve as the functional gate dielectric (in the case of the I/O region 200A) or dummy gate dielectric (in the case of the non-I/O region 200B) for their respective transistors, as will be discussed below in more detail.

Due to the unique fabrication processing flow of the present disclosure, the overall dielectric structure composed of the dielectric segments 400 and the dielectric layer 330 have a top-thick-side-narrow profile in the cross-sectional view of FIG. 7. In more detail, the dielectric segments 400 are located on the top surfaces of the fin structures 120 and each have a thickness 410. Meanwhile, the portions of the dielectric layer 330 that are located on the sidewalls of the fin structures 120 each have the thickness 340. In some embodiments, the thickness 410 is at least 20 angstroms thicker than the thickness 340. In some embodiments, a ratio of the thickness 410 and the thickness 340 is in a range between about 1.8:1 and about 2.3:1. This difference in thickness is attributable to the fact that, the deposition process 220 and the etching process 270 resulted in the dielectric layer 230 and the mask layer 250 being formed on the top surfaces of the fin structures 120 but not on the side surfaces of the fin structures 120, and subsequently the dielectric layer 330 is formed conformally on the both the side surfaces of the fin structures 120 and the top surfaces of the mask layer 250.

In other words, the overall dielectric structure composed of the dielectric segments 400 and the dielectric layer 330 gains an extra height bump (in the Z-direction) at the top from the presence of the dielectric layer 230 and the mask layer 250. Since the dielectric segment 400 will be used as a mask layer to protect the fin structure 120 located therebelow from being etched in a later dummy gate electrode removal process, the thicker thickness 410 allows the dielectric segment 400 to function more effectively as such a protective mask. Consequently, the dummy gate electrode may be removed more completely using harder or longer etching processes without damaging the fin structures 120, thereby preventing or reducing the fin-top loss that has been plaguing conventional semiconductor fabrication processes.

Meanwhile, the above approach of the present disclosure also achieves the thicker dielectric segments 400 without increasing the side thickness (e.g., in the Y-direction) of the dielectric layer 330. Thus, a fin-to-fin spacing 450 (e.g., a distance separating adjacent pairs of fin structures) may still be maintained. As discussed above, as semiconductor device scaling down continues, maintaining sufficient fin-to-fin spacing 450 is important, because otherwise it could lead to an incomplete removal of the dummy gate electrode material, which could degrade device performance or reduce device yield. Therefore, the unique fabrication process flow of the present disclosure simultaneously achieves two objectives:

1. thickening the top segment of the dielectric structure above the fin structures 120; and
2. maintaining sufficient fin-to-fin spacing 450.

It is noted that the unique fabrication process flow herein may lead to some unique physical characteristics of the dielectric structure composed of the dielectric segments 400 and the dielectric layers 330. Aside from the top-thick-side-narrow cross-sectional profile, the dielectric structure may also contain certain elements that would not exist in conventional dielectric structures formed around the fin structures, or at least not to the same extent. For example, since the mask layer 250 contained carbon and nitrogen (e.g., the mask layer 250 was a SiCN layer) before the annealing process 350 was performed, the resulting dielectric segments 400 may still contain carbon and/or nitrogen. In comparison, conventional dielectric layers formed over the semiconductor fin structures may only contain silicon and oxygen. As such, the presence of carbon and/or nitrogen in the dielectric segments 400 may be evidence that the fabrication process flow of the present disclosure was used to form the resulting IC device.

While the fabrication processing flows performed in FIGS. 2-7 may already optimize the performance of the IC device 200, additional processing steps may be performed to further optimize the IC device 200, based on the differences between the transistors in the I/O region 200A and the transistors in the non-I/O region 200B. For example, the dielectric layer formed over the fin structures 120 in the non-I/O region 200B may be further "trimmed" to reduce its thickness without affecting the thickness of the dielectric layer firmed over the fin structures 120 in the I/O region 200A, as discussed below in more detail.

Figure 8:
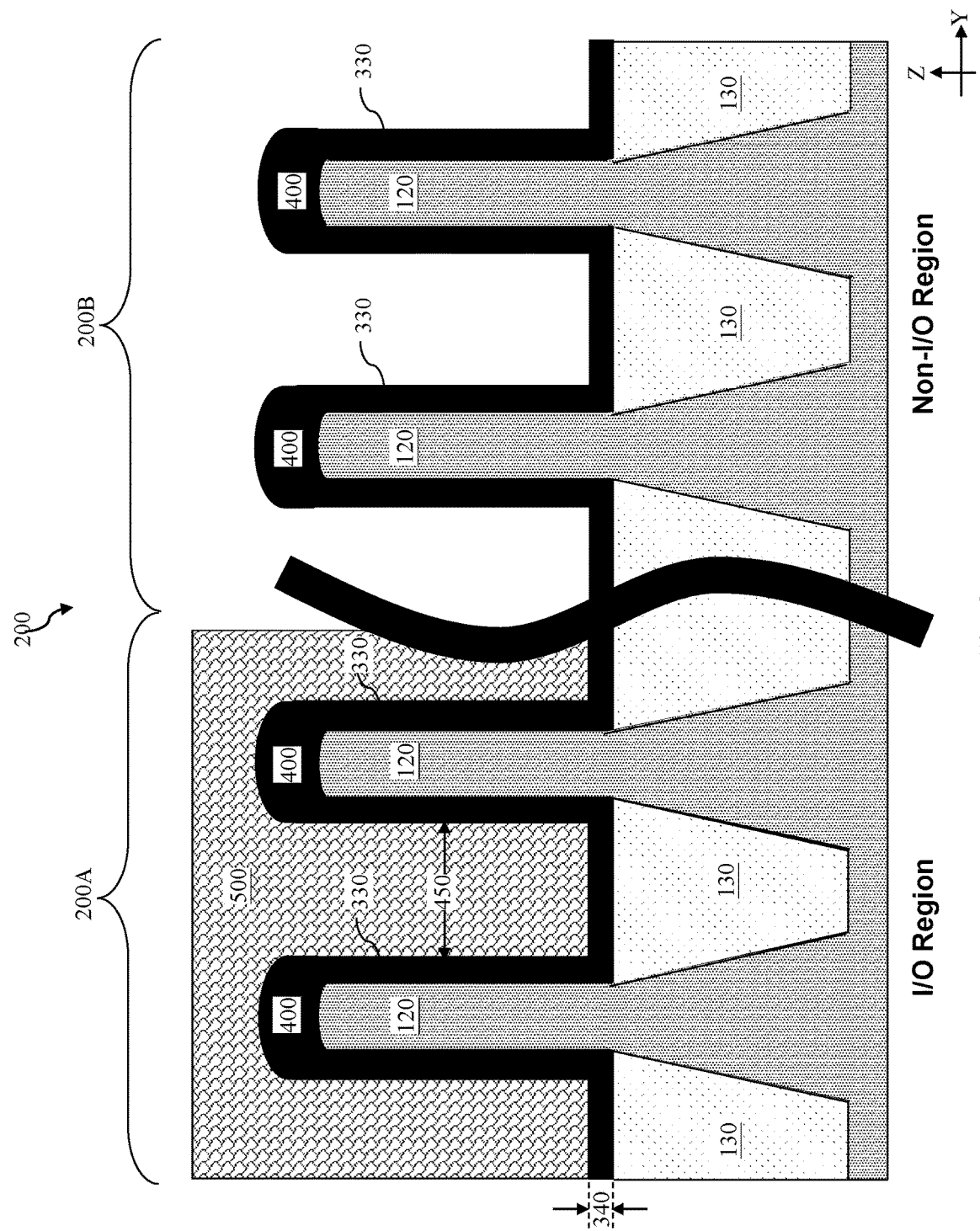

Referring now to FIG. 8, a patterned photoresist layer 500 is formed over the IC device 200. The patterned photoresist layer 500 is formed in the I/O region 200A but not in the non-I/O region 200B. The patterned photoresist layer 500 covers up the fin structures 120, the dielectric layer 330, and the dielectric segments 400 in the I/O region 200A, while leaving the components of the non-I/O region exposed.

Figure 9:
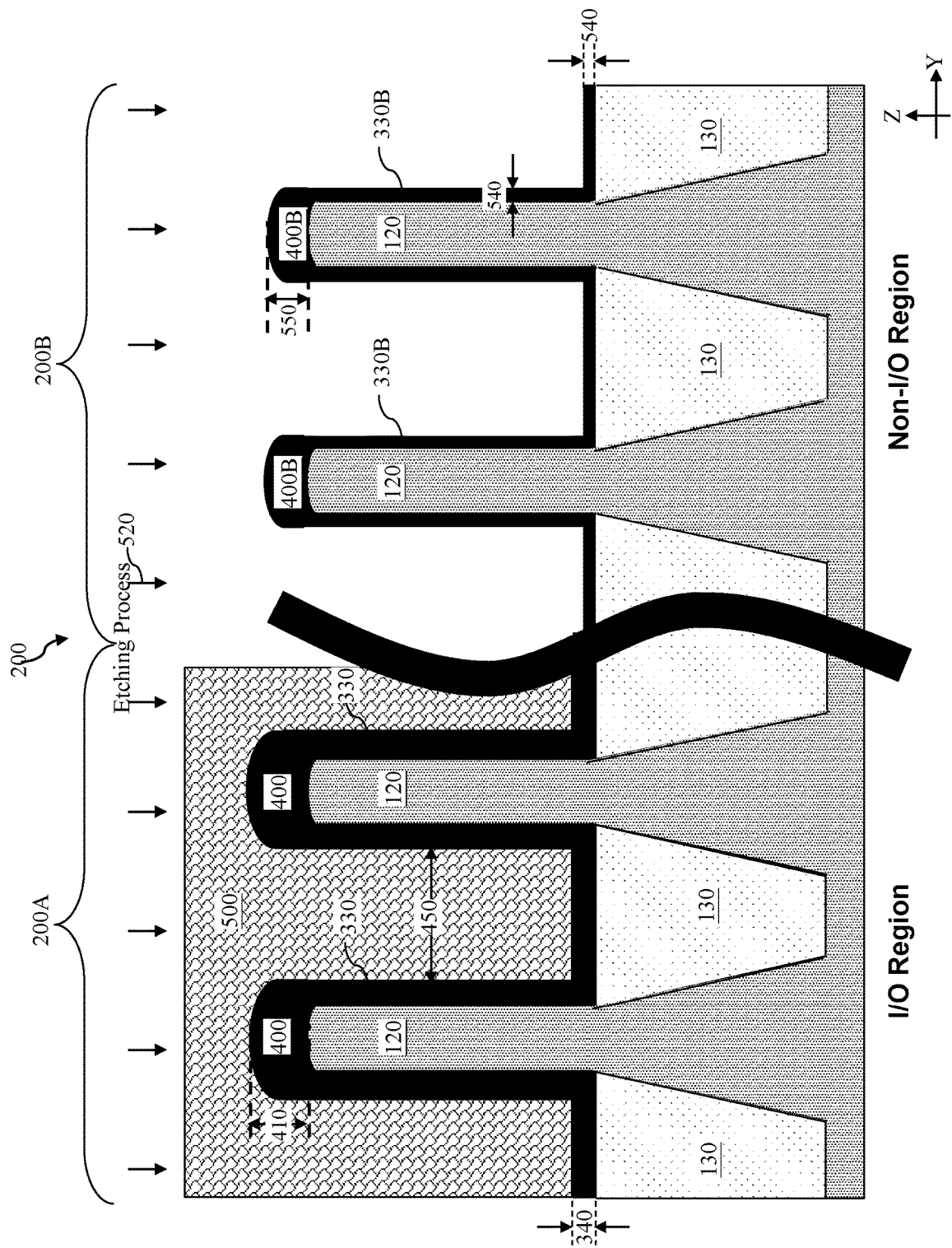

Referring now to FIG. 9, an etching process 520 is performed to the IC device 200, where the patterned photoresist layer 500 serves as a protective mask. The etching process 520 partially etches away the dielectric layer 330 and the dielectric segments 400 in the non-I/O region 200B, while the dielectric layer 330 and the dielectric segments 400 in the I/O region 200A are protected from being etched. As a result, dielectric layer 330B and dielectric segments 400B remain in the non-I/O region 200B. The dielectric layer 330B (e.g., including the portion thereof disposed on the sidewalls of the fin structures 120) has a thickness 540, which is smaller than the thickness 340. The dielectric segment 400B has a thickness 550, which is smaller than the thickness 410. Nevertheless, the overall dielectric layer or structure (including the dielectric layer 330B and the dielectric segment 400B) formed over the fin structures 120 in the non-I/O region 200B still has a top-thick-side-narrow cross-sectional profile. In other words, the thickness 550 is still greater than the thickness 540. In some embodiments, the thickness 550 is greater than the thickness 540 by at least about 10 angstroms. In some embodiments, a ratio of the thickness 550 and the thickness 540 is in a range between about 1.6:1 and about 2.1:1.

Figure 10:
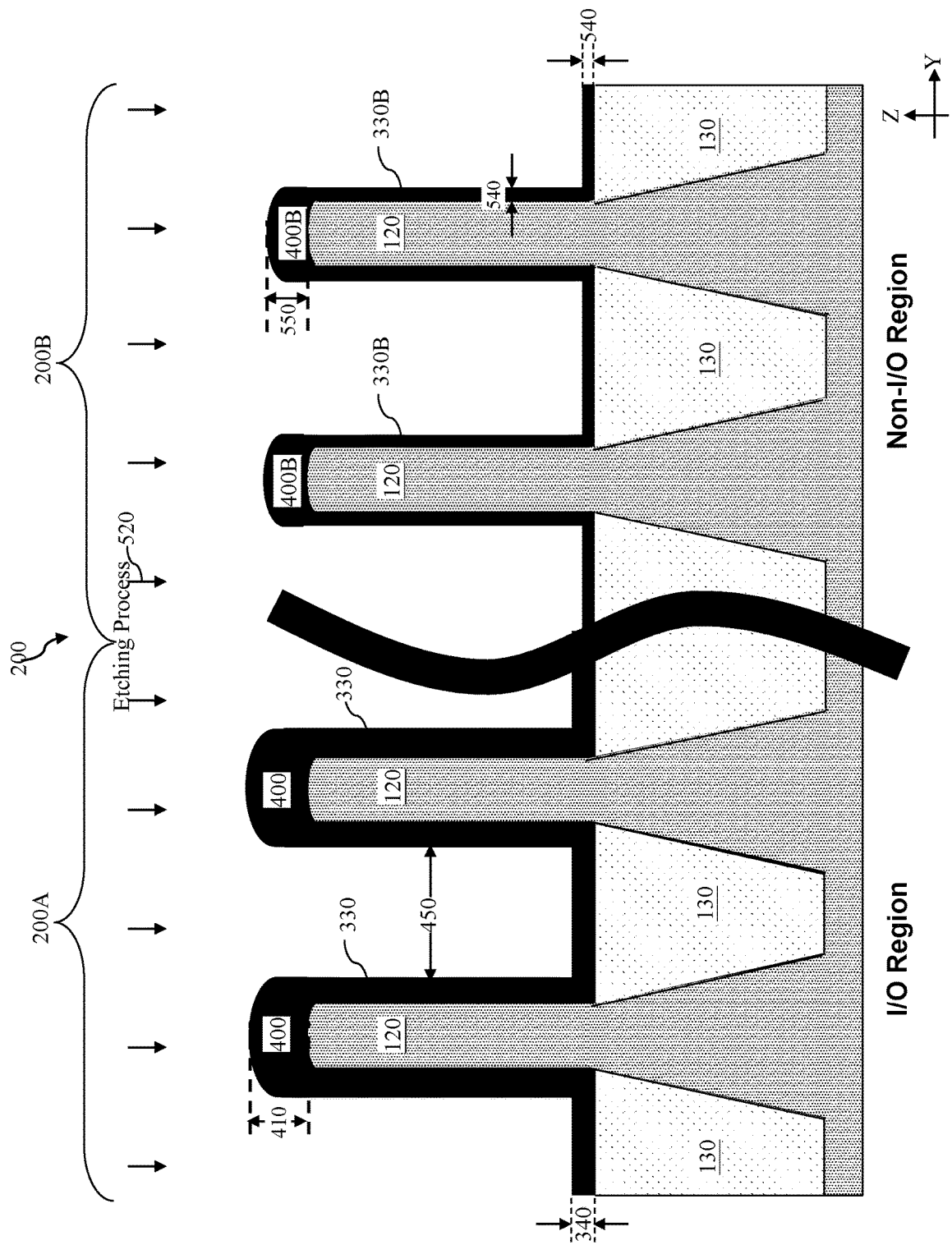

Referring now to FIG. 10, the patterned photoresist layer 500 is removed, for example using a photoresist ashing or stripping process using a sulfuric peroxide mix (SPM). This process may also be referred to as an SPM cleaning process.

Figure 11:
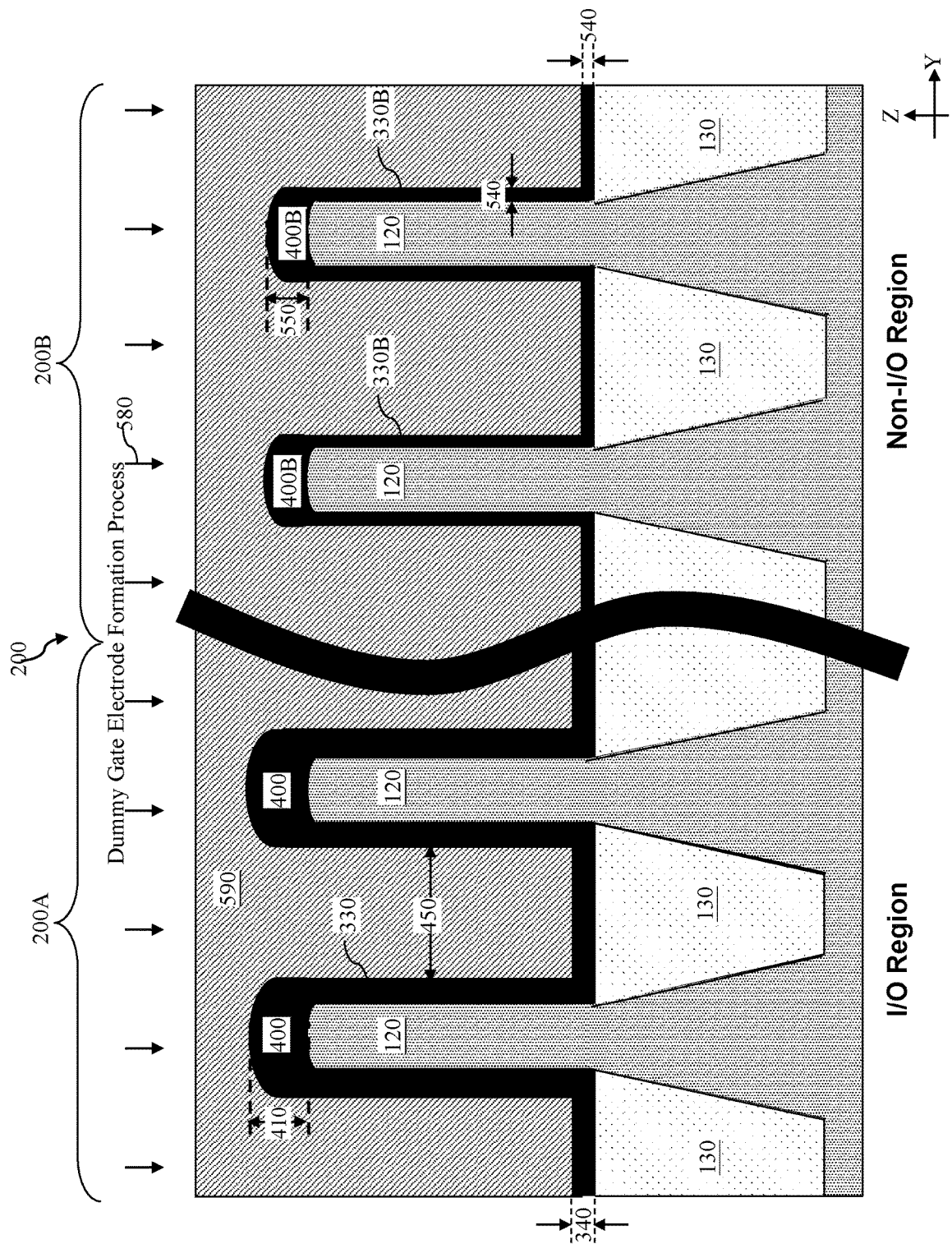

Referring now to FIG. 11, a dummy gate electrode formation process 580 is used to form a dummy gate electrode layer 590 over the dielectric layers 330 and 330B and over the dielectric segments 400 and 400B. The dummy gate electrode layer 590 may be formed in both the I/O region 200A and the non-I/O region 200B. In some embodiments, the dummy gate electrode formation process 580 may include one or more deposition processes such as CVD, PVD, ALD, or combinations thereof, and the dummy gate electrode layer 590 may be formed to include a polysilicon material. Although not directly visible from the Y-Z cross-sectional view show of FIG. 11, it is understood that gate spacers may be formed on sidewalls of the dummy gate electrode layer 590, and source/drain features may also be formed (e.g., using epitaxial growth) on portions of the fin structures 120 outside the dummy gate electrode layer 590.

Figure 12:
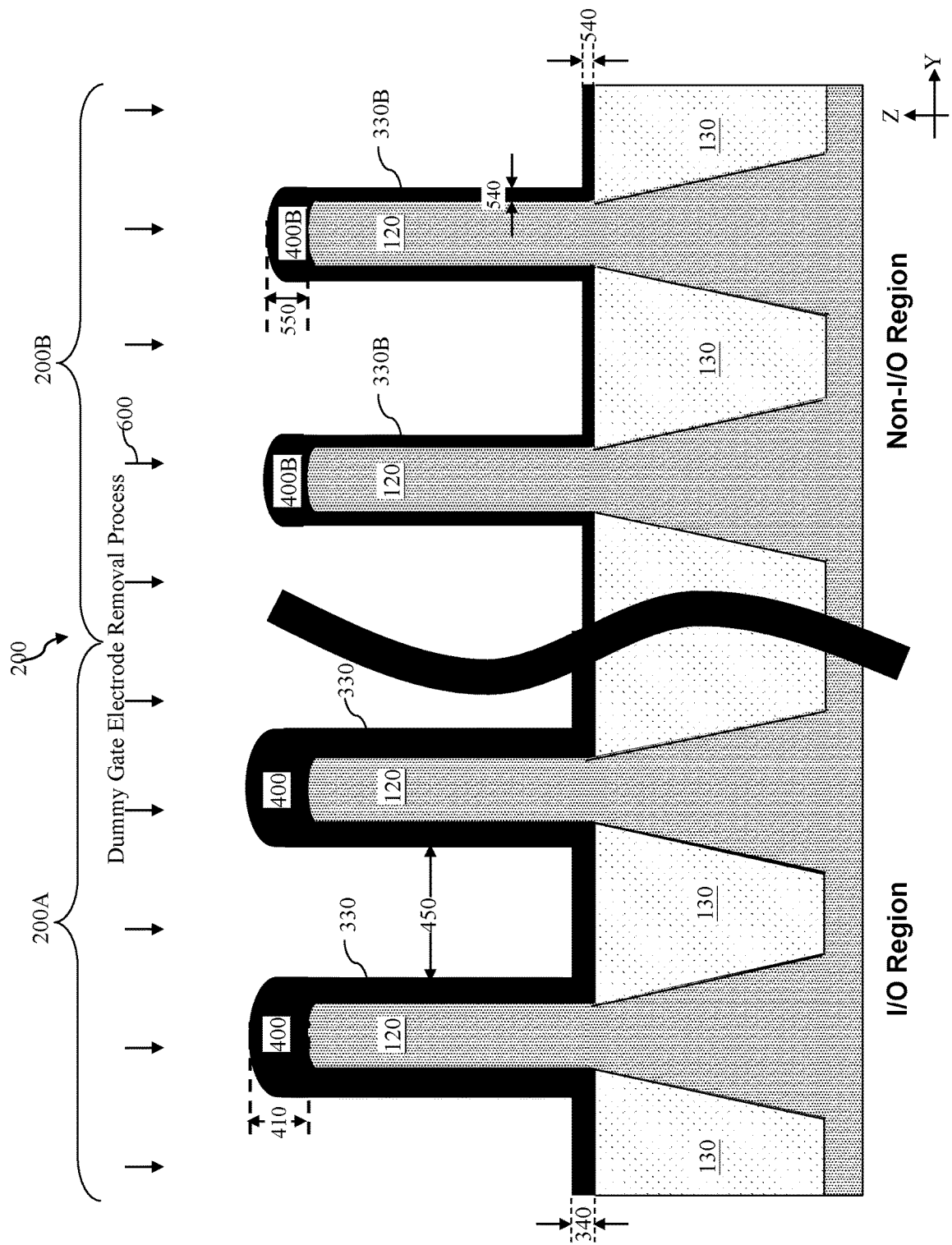

Referring now to FIG. 12, a dummy gate electrode removal process 600 is performed to the IC device 200 to remove the dummy gate electrode layer 590 in both the I/O region 200A and the non-I/O region 200B. As discussed above, this dummy gate electrode removal process 600 may include one or more etching processes to etch away the polysilicon material of the dummy gate electrode layer 590. Had the processes of the present disclosure not been performed, such etching processes may either not be able to completely remove the dummy gate electrode layer 590 (which may leave a polysilicon residue between the fin structures 120), or the etching processes may cause damage to the fin structures 120 (e.g., fin-top height loss). In comparison, the top-thick-side-narrow profile of the dielectric layer on the fin structures 120 herein allows the etching processes to be performed sufficiently long or hard without damaging the fin structures 120, since the thicker dielectric segments 400 are capable of withstanding longer or harder etching processes. Meanwhile, the narrow profile of the dielectric layers 330 and 330B on the sidewalls of the fin structures 120 still allows the fin-to-fin spacing 450 to remain sufficiently high. As a result, the IC device 200 has improved performance and enhanced yield compared to conventional IC devices.

Figure 13:
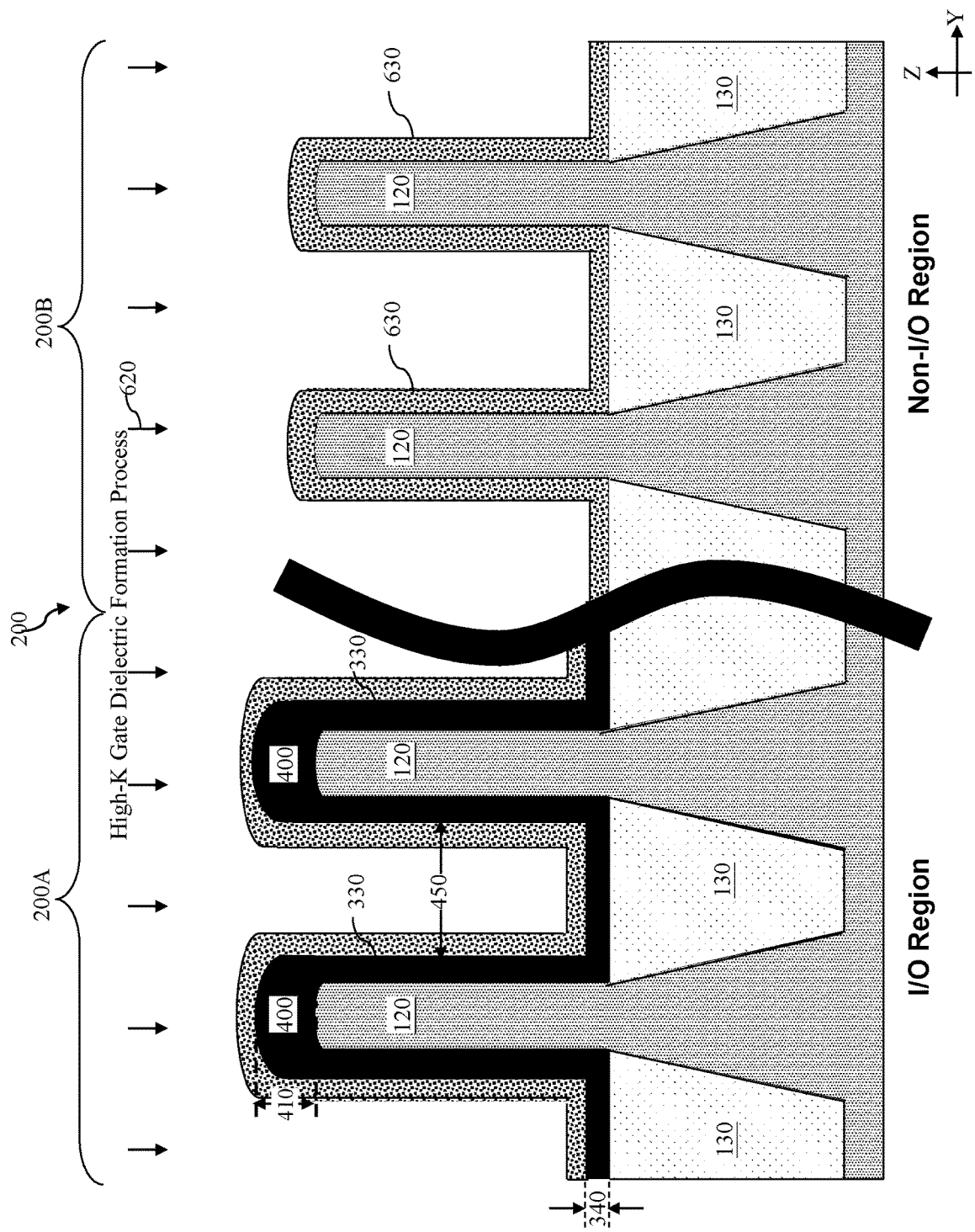

Referring now to FIG. 13, a high-k gate dielectric formation process 620 is performed to the IC device 200 to form a high-k gate dielectric layer 630 in the non-I/O region and the I/O region 200A. In more detail, the dielectric layer 330B and the dielectric segments 400B in the non-I/O region 200B are removed, for example using one or more etching processes. The dielectric layer 330 and the dielectric segments 400 in the I/O region 200A may be protected by a mask, for example a photoresist mask. Thereafter, a high-k dielectric material is deposited over the side and upper surfaces of the fin structures 120 and over the dielectric layer 330. In some embodiments, the high-k dielectric material is a dielectric material with a dielectric constant greater than that of silicon oxide (about 3.9). Example materials of the high-k gate dielectric material include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. The dielectric layer 330 and the dielectric segments 400 in the I/O region 200A need not be replaced by the high-k dielectric material, because the material composition of the dielectric layer 330 and the dielectric segments 400 (e.g., silicon oxide) may be more suitable as the gate dielectric for the I/O transistors.

Figure 14:
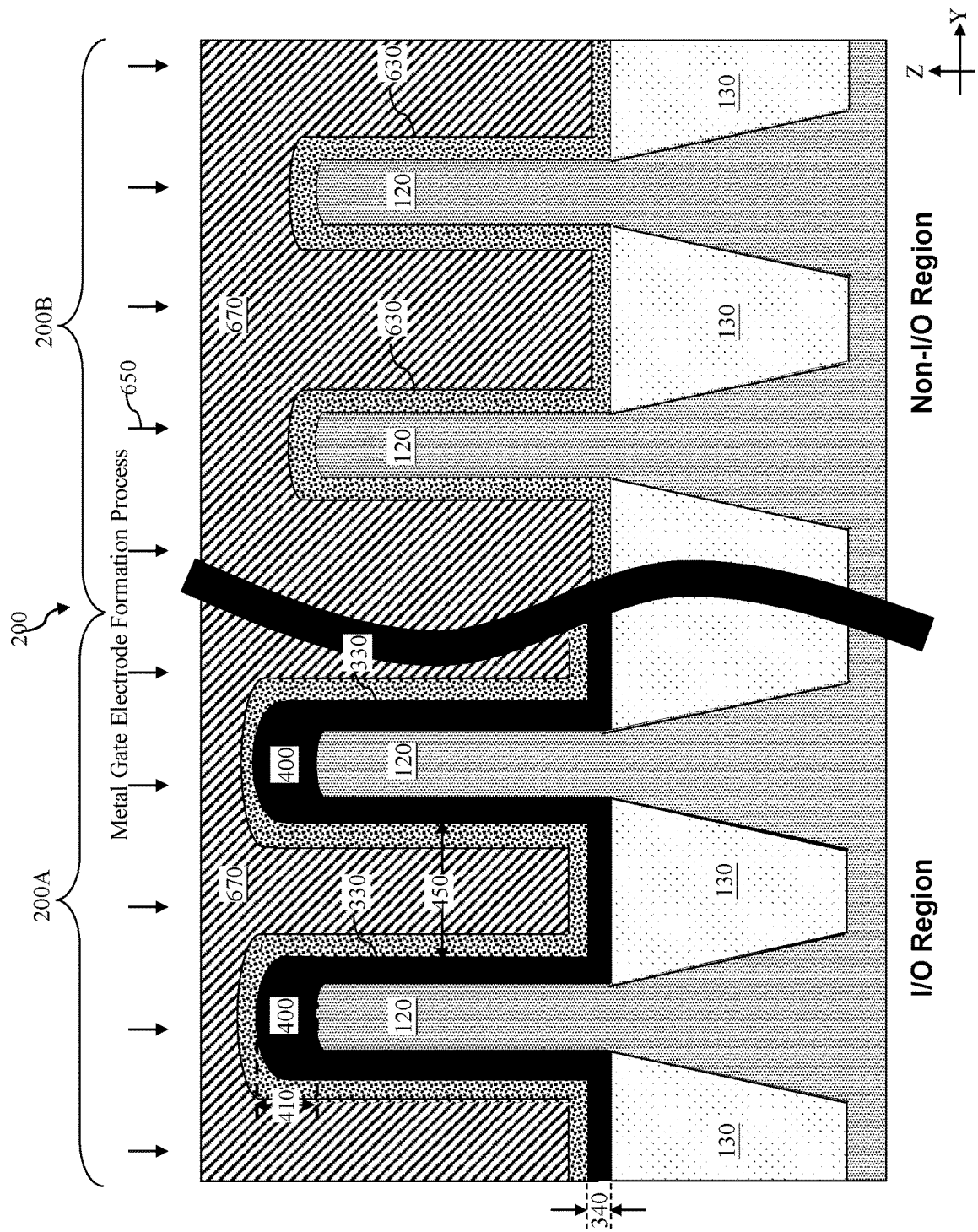

Referring now to FIG. 14, a metal gate electrode formation process 650 is performed to the IC device to form a metal gate electrode layer 670 in both the I/O region 200A and the non-I/O region 200B. The metal gate electrode layer 670 partially wraps around the fin structures 120. In the I/O region 200A, the dielectric layer 330 and the dielectric segments 400 collectively serve as the gate dielectric layer for the transistors in the I/O region 200A, and such a gate dielectric layer is disposed between the metal gate electrode layer 670 and the fin structures 120 in the I/O region 200A. In the non-I/O region 200B, the high-k gate dielectric layer 630 is disposed between the metal gate electrode layer 670 and the fin structures 120 in the I/O region 200B.

The metal gate electrode layer 670 may include one or more work function metal layers and one or more fill metal layers. The work function metal layers may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), aluminum titanium nitride (TiAlN), zirconium aluminide (ZrAl), tungsten aluminide (WAl), tantalum aluminide (TaAl), hafnium aluminide (HfAl), or combinations thereof. The fill metal layer may serve as a main conductive portion of the metal gate electrode layer 670. In some embodiments, additional layers may be formed above or below the metal gate electrode layer 670, such as interfacial layers, capping layers, diffusion/barrier layers, or other applicable layers.

Figure 15:
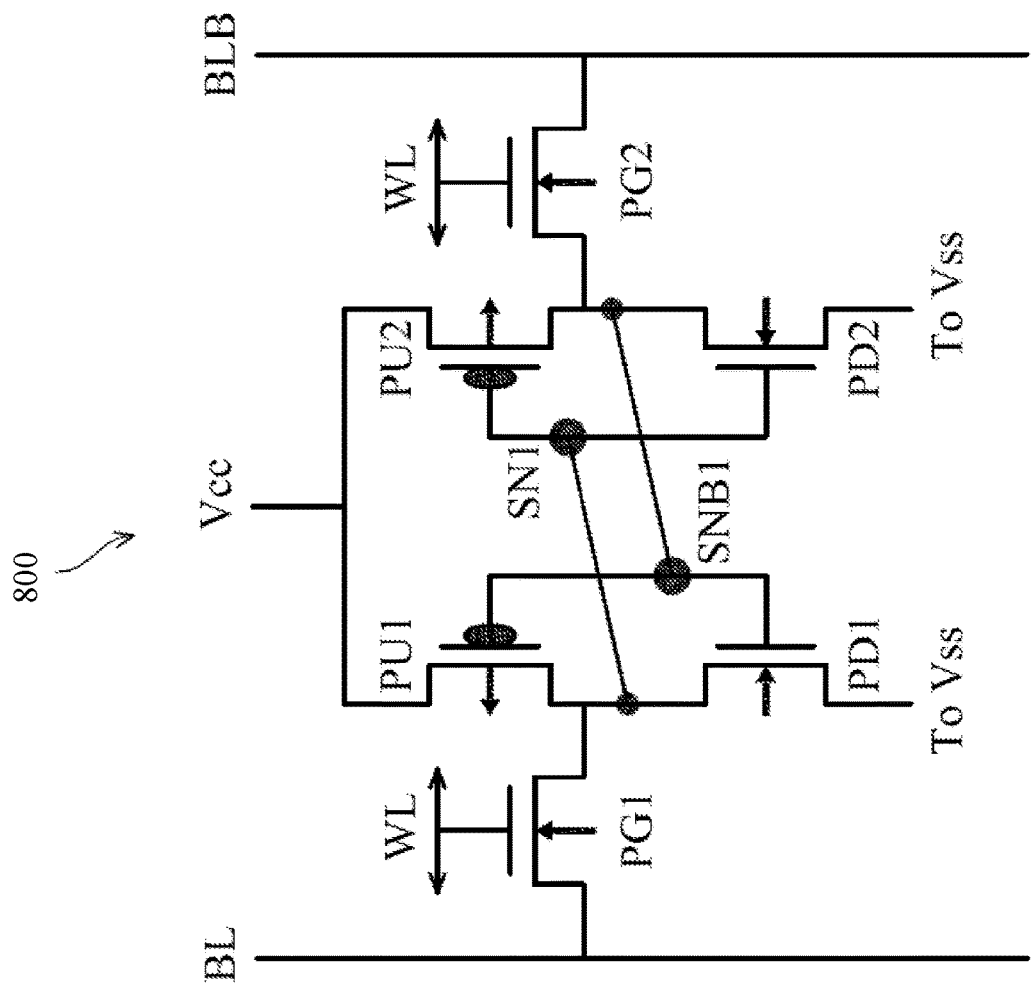
FIG. 15 illustrates a Static Random Access Memory (SRAM) cell according to an embodiment of the present disclosure.

It is understood that the IC device 200 may be implemented in a variety of IC applications, including memory devices such as Static Random-Access Memory (SRAM) devices. In that regard, FIG. 15 illustrates an example circuit schematic for a single-port SRAM cell (e.g., 1-bit SRAM cell) 800. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

Figure 16:
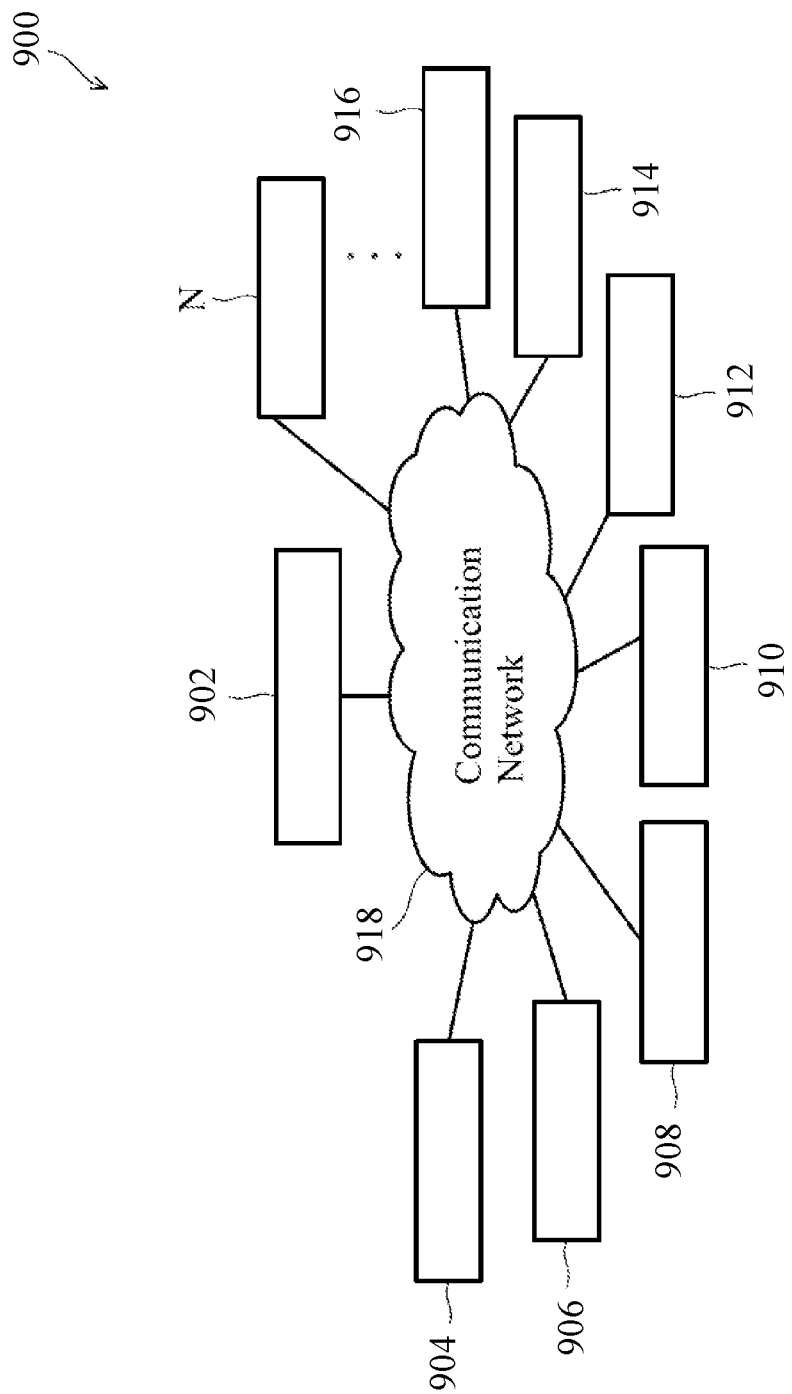
FIG. 16 illustrates an integrated circuit fabrication system according to an embodiment of the present disclosure.

FIG. 16 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Figure 17:
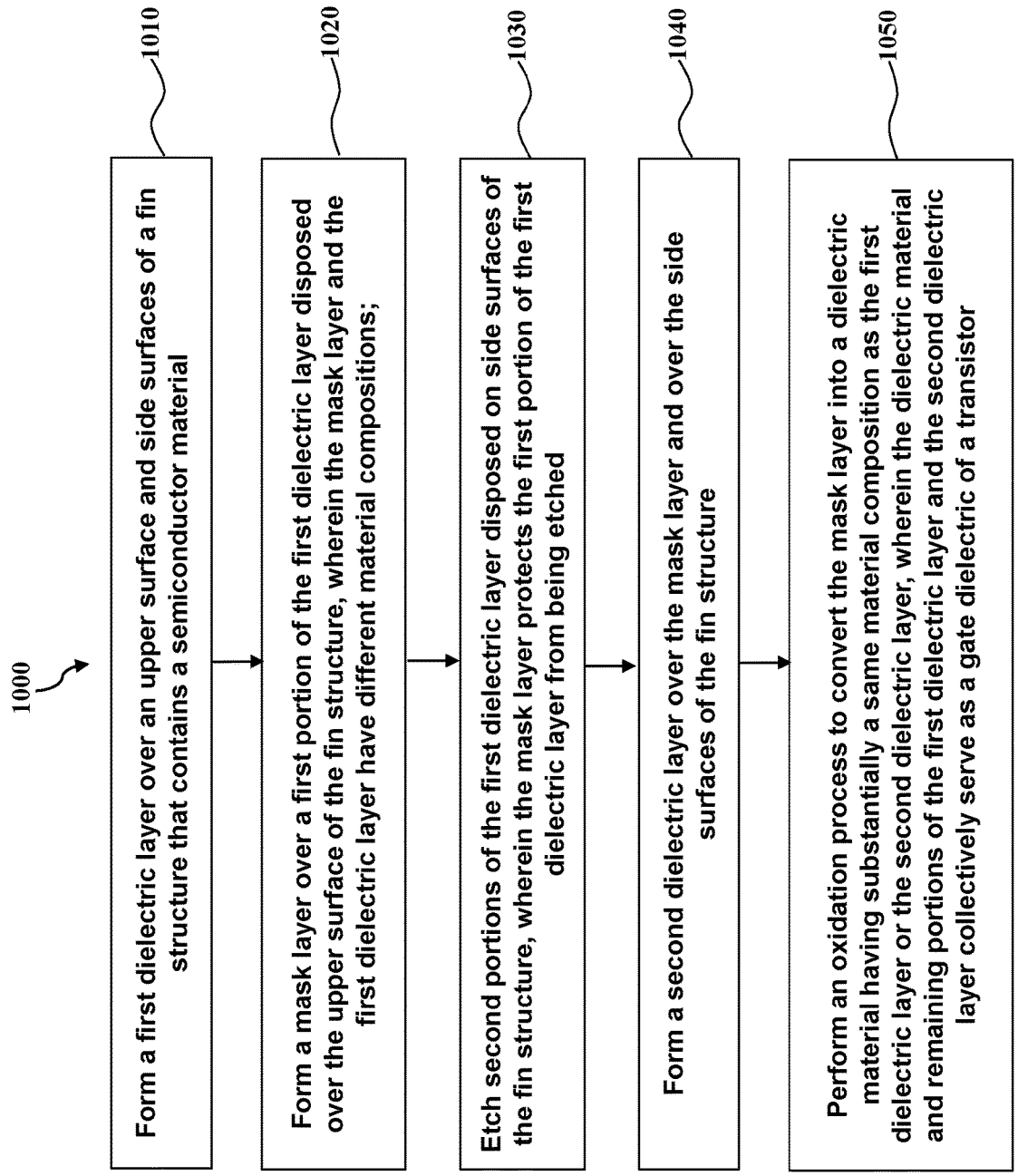
FIG. 17 is a flowchart illustrating a method of fabricating a semiconductor device according to various aspects of the present disclosure.

FIG. 17 is a flowchart illustrating a method 1000 of fabricating a semiconductor device. The method 1000 includes a step 1010 to form a first dielectric layer over an upper surface and side surfaces of a fin structure that contains a semiconductor material.

The method 1000 includes a step 1020 to form a mask layer over a first portion of the first dielectric layer disposed over the upper surface of the fin structure. The mask layer and the first dielectric layer have different material compositions.

The method 1000 includes a step 1030 to etch second portions of the first dielectric layer disposed on side surfaces of the fin structure. The mask layer protects the first portion of the first dielectric layer from being etched.

The method 1000 includes a step 1040 to form a second dielectric layer over the mask layer and over the side surfaces of the fin structure.

The method 1000 includes a step 1050 to perform an oxidation process to convert the mask layer into a dielectric material having substantially a same material composition as the first dielectric layer or the second dielectric layer. The dielectric material and remaining portions of the first dielectric layer and the second dielectric layer collectively serve as a gate dielectric of a transistor.

In some embodiments, the first dielectric layer and the second dielectric layer are each formed as a silicon oxide layer.

In some embodiments, the forming the mask layer includes forming a non-silicon-oxide material as the mask layer.

In some embodiments, the forming the non-silicon-oxide material includes forming silicon carbon nitride (SiCN) as the non-silicon-oxide material.

In some embodiments, the oxidation process includes an oxygen annealing process to convert the non-silicon-oxide material into a silicon oxide material.

In some embodiments, the forming the first dielectric layer and the forming the mask layer are both performed within a Plasma Enhanced Atomic Layer Deposition (PEALD) chamber. In some embodiments, the first dielectric layer is formed using silicon and oxygen precursors, and the mask layer is formed using the silicon precursor but without the oxygen precursor.

In some embodiments, the gate dielectric is formed such that a top portion thereof is substantially thicker than side portions thereof.

In some embodiments, the etching completely exposes the side surfaces of the fin structure.

In some embodiments, the fin structure is a fin structure of a non-input/output (non-I/O) device, and wherein the method further comprises: forming a dummy gate electrode over the gate dielectric; replacing the gate dielectric with a high-k gate dielectric; and replacing the dummy gate electrode with a metal gate electrode, wherein the metal gate electrode is formed over the high-k gate dielectric.

In some embodiments, the fin structure is a fin structure of an input/output (I/O) device, and wherein the method further comprises: forming a dummy gate electrode over the gate dielectric; and replacing the dummy gate electrode with a metal gate electrode, wherein the metal gate electrode is formed over the gate dielectric.

In some embodiments, the first dielectric layer is formed over a plurality of fin structures in both an input/output (I/O) region and a non-I/O region, and wherein the method further comprises: forming a photoresist mask to cover up the fin structures located in the I/O region but not the fin structures in the non-I/O region; partially etching the gate dielectric in the non-I/O region while the gate dielectric in the I/O region is protected by the photoresist mask; and thereafter removing the photoresist mask.

It is understood that additional steps may be performed before, during, or after the steps 1010-1050. For example, the method may include the formation of conductive contacts and vias, interconnect lines, packaging, and testing processes. For reasons of simplicity, these additional steps are not discussed in detail herein.

In summary, the present disclosure involves performing multiple deposition and etching processes to form a dielectric layer having a top-thick-side-narrow cross-sectional profile on the fin structures. Such a profile offers advantages over conventional devices. It is understood, however, that no particular advantage is required, other embodiments may offer different advantages, and that not all advantages are necessarily disclosed herein. One advantage is the reduction of fin-top height loss. In that regard, the thicker top portion of the dielectric layer located at the top surface of the fin structures means that the dielectric layer to better serve as a protective mask during etching processes, which are performed in later fabrication stages to remove the dummy gate electrode. As such, the fin structures are protected from being damaged by the etching processes. Another advantage is a more complete removal of the dummy gate electrode and less residue. This is because the thicker top portion of the dielectric layer allows longer or harder etching processes to be performed during the dummy polysilicon gate electrode removal, which can leave no residue (or at least not as much) residue of the dummy gate electrode behind. Yet another advantage is that the processes of the present disclosure are performed without reducing the fin-to-fin spacing, since the side segments of the dielectric layer are not thickened even though the top segments of the dielectric layer are thickened. Due to these advantages, the device performance and/or yield may be improved compared to conventional IC devices. Other advantages may include ease of fabrication and compatibility with existing fabrication processes.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

One aspect of the present disclosure involves a method. A first dielectric layer is formed over an upper surface and side surfaces of a fin structure that contains a semiconductor material. A mask layer is formed over a first portion of the first dielectric layer disposed over the upper surface of the fin structure. The mask layer and the first dielectric layer have different material compositions. Second portions of the first dielectric layer disposed on side surfaces of the fin structure are etched. The mask layer protects the first portion of the first dielectric layer from being etched. Thereafter, a second dielectric layer is formed over the mask layer and over the side surfaces of the fin structure. After the second dielectric layer has been formed, an oxidation process is performed to convert the mask layer into a dielectric material having substantially a same material composition as the first dielectric layer or the second dielectric layer. The dielectric material and remaining portions of the first dielectric layer and the second dielectric layer collectively serve as a gate dielectric of a transistor.

Another aspect of the present disclosure involves a device. A first fin structure and a second fin structure each protrude vertically out of a substrate. The first fin structure and the second fin structure each contain a semiconductor material. A first segment of a first gate dielectric disposed over a side surface of the first fin structure. The first segment of the first gate dielectric has a first thickness. A second segment of the first gate dielectric is disposed over a top surface of the first fin structure. The second segment of the first gate dielectric has a second thickness that is substantially greater than the first thickness. A second gate dielectric is disposed over a side surface and a top surface of the second fin structure. The second gate dielectric has a substantially uniform thickness. The second segment of the first gate dielectric is substantially thicker than the second gate dielectric. A first gate electrode is disposed over the first segment and the second segment of the first gate dielectric. A second gate electrode is disposed over the second gate dielectric.

Yet another aspect of the present disclosure involves a device. The device includes a first transistor and a second transistor. The first transistor is located in a first region of the semiconductor device. The first transistor includes a first fin, a first gate dielectric disposed over the first fin, and a first metal gate electrode disposed over the first gate dielectric. The first gate dielectric contains silicon oxide. A top portion of the first gate dielectric disposed on a top surface of the first fin is substantially thicker than a side portion of the first gate dielectric disposed on sidewalls of the first fin. The second transistor is located in a second region of the semiconductor device. The second transistor includes a second fin, a second gate dielectric disposed over the second fin, and a second metal gate electrode disposed over the second gate dielectric. The second gate dielectric has a dielectric constant greater than about 3.9. A top portion of the second gate dielectric disposed on a top surface of the second fin and a side portion of the second gate dielectric disposed on sidewalls of the second fin have substantially similar thicknesses.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor device, comprising:
   a first fin structure that protrudes vertically out of a substrate, wherein the first fin structure contains a semiconductor material;
   a first segment of a gate dielectric disposed over at least a side surface of the first fin structure, wherein the first segment of the gate dielectric has a first thickness;
   a second segment of the gate dielectric disposed over a top surface of the first fin structure, wherein the second segment of the gate dielectric has a second thickness that is substantially greater than the first thickness, and wherein an uppermost surface of the second segment of the gate dielectric is more curved than a side surface of the second segment of the gate dielectric in a cross-sectional side view;
   a second fin structure that protrudes vertically out of the substrate, wherein the second fin structure contains the semiconductor material;
   a third segment of the gate dielectric disposed over at least a side surface of the second fin structure, wherein the third segment of the gate dielectric has a third thickness, wherein the first segment of the gate dielectric is connected to the third segment of the gate dielectric via a bottom segment of the gate dielectric, and wherein the bottom segment and the second segment of the gate dielectric have different material compositions;
   a fourth segment of the gate dielectric disposed over a top surface of the second fin structure, wherein the fourth segment of the gate dielectric has a fourth thickness that is substantially greater than the third thickness; and
   a gate electrode disposed over the first segment, the second segment, the third segment, and the fourth segment of the gate dielectric.

2. The semiconductor device of claim 1, wherein the second segment or the fourth segment of the gate dielectric contains carbon or carbon.

3. The semiconductor device of claim 1, wherein the first segment and the second segment of the gate dielectric extends directly to the semiconductor material.

4. The semiconductor device of claim 1, wherein a ratio of the second thickness and the first thickness is in a range between about 1.8:1 and about 2.3:1.

5. The semiconductor device of claim 1, further comprising a fifth segment of the gate dielectric, wherein the fifth segment is disposed between the gate electrode and a rest of the gate dielectric, wherein a bottom surface of the fifth segment of the gate dielectric extends to a top surface of the second segment of the gate dielectric, and wherein a bottom surface of the gate electrode extends to an upper surface of the fifth segment of the gate dielectric.

6. The semiconductor device of claim 5, wherein the fifth segment has a greater dielectric constant than the first segment or the second segment of the gate dielectric.

7. The semiconductor device of claim 1, wherein the first fin structure, the second fin structure, the first segment of the gate dielectric, the second segment of the gate dielectric, the third segment of the gate dielectric, the fourth segment of the gate dielectric, and the gate electrode are components of a first type of transistor, and wherein the semiconductor device further includes a second type of transistor different from the first type of transistor, and wherein a gate dielectric of the second type of transistor is substantially thinner than the gate dielectric of the first type of transistor.

8. The semiconductor device of claim 7, wherein:
   the gate dielectric of the first type of transistor includes a first dielectric material and a second dielectric material having a greater dielectric constant than the first dielectric material; and
   the gate dielectric of the second type of transistor includes the second dielectric material but not the first dielectric material.

9. A semiconductor device, comprising:
   a first fin structure and a second fin structure that each protrude vertically out of a substrate, wherein the first fin structure and the second fin structure each have a same semiconductor material composition consisting of silicon;

a first segment of a first gate dielectric disposed over a side surface of the first fin structure, wherein the first segment of the first gate dielectric has a first thickness;

a second segment of the first gate dielectric disposed over a top surface of the first fin structure, wherein the second segment of the first gate dielectric has a second thickness that is substantially greater than the first thickness;

a second gate dielectric disposed over a side surface and a top surface of the second fin structure, wherein the second gate dielectric has a substantially uniform thickness, and wherein the second segment of the first gate dielectric is substantially thicker than the second gate dielectric;

a first gate electrode disposed over the first segment and the second segment of the first gate dielectric; and a second gate electrode disposed over the second gate dielectric;

wherein:

the first segment and the second segment of the first gate dielectric extends to the silicon of the first fin structure; or the second gate dielectric extends to the silicon of the second fin structure.

10. The semiconductor device of claim 9, further comprising a plurality of isolation structures disposed over the substrate, wherein the first gate dielectric includes a plurality of laterally extending segments disposed over the plurality of isolation structures, respectively, and wherein the plurality of laterally extending segments each have a different material composition than the second segment of the first gate dielectric.

11. The semiconductor device of claim 9, further comprising:

a third fin structure that protrudes vertically out of the substrate, wherein the third fin structure contains the silicon, wherein the third fin structure and the first fin structure are separated from each other by a dielectric isolation structure;

a first segment of a third gate dielectric disposed over a side surface of the third fin structure, wherein the first segment of the third gate dielectric has a third thickness; and a second segment of the third gate dielectric disposed over a top surface of the third fin structure, wherein the second segment of the third gate dielectric has a fourth thickness that is substantially greater than the third thickness;

wherein a portion of the first segment of the first gate dielectric and a portion of the first segment of the third gate dielectric laterally extend into each other and are disposed over the dielectric isolation structure.

12. The semiconductor device of claim 9, wherein the first segment or the second segment of the first gate dielectric contains carbon or nitrogen.

13. The semiconductor device of claim 9, wherein:

the first fin structure, the first gate dielectric, and the first gate electrode are components of an input/output (I/O) transistor; and the second fin structure, the second gate dielectric, and the second gate electrode are components of a non-I/O transistor.

14. The semiconductor device of claim 9, wherein the first gate dielectric further includes a third segment that is disposed over a side surface of the first segment and over a top surface of the second segment, wherein the third segment has a different material composition than the first segment or the second segment.

15. The semiconductor device of claim 14, wherein the third segment of the first gate dielectric and the second gate dielectric have a same material composition, and wherein the third segment of the first gate dielectric and the second gate dielectric each have a greater dielectric constant than the first segment or the second segment of the first gate dielectric.

16. The semiconductor device of claim 9, further comprising:

a first isolation structure disposed adjacent to a first portion of the substrate out of which the first fin structure protrudes; and a second isolation structure disposed adjacent to a second portion of the substrate out of which the second fin structure protrudes;

wherein a number of layers disposed between the first isolation structure and the first gate electrode is greater than a number of layers disposed between the second isolation structure and the second gate electrode.

17. A semiconductor device, comprising:

a plurality of first transistors located in a first region of the semiconductor device, wherein the plurality of first transistors includes a plurality of first fins, a plurality of first gate dielectrics disposed over the first fins, respectively, and a first metal gate electrode disposed over the first gate dielectrics, wherein each of the first gate dielectrics contains silicon oxide, wherein a top portion of each of the first gate dielectrics disposed on a top surface of the first fin is substantially thicker than a side portion of each of the first gate dielectrics disposed on sidewalls of the first fin, wherein the first gate dielectrics are coupled together by a plurality of bottom portions of the first gate dielectrics, and wherein the bottom portions and the top portions of the first gate dielectrics have different material compositions; and a second transistor located in a second region of the semiconductor device, wherein the second transistor includes a second fin, a second gate dielectric disposed over the second fin, and a second metal gate electrode disposed over the second gate dielectric, wherein the second gate dielectric has a dielectric constant greater than about 3.9, and wherein a top portion of the second gate dielectric disposed on a top surface of the second fin and a side portion of the second gate dielectric disposed on sidewalls of the second fin have substantially similar thicknesses.

18. The semiconductor device of claim 17, wherein:

the first region is an input/output (I/O) region; and the second region is a non-I/O region.

19. The semiconductor device of claim 17, wherein the first gate dielectrics further contain carbon or nitrogen.

20. The semiconductor device of claim 17, wherein the top portion of each of the first gate dielectrics is at least 20 angstroms thicker than the side portion of each of the first gate dielectrics.

* * * * *